(12) United States Patent
Moehlmann

(10) Patent No.: US 9,614,536 B2
(45) Date of Patent: Apr. 4, 2017

(54) PHASE LOCKED LOOP WITH LOCK DETECTOR

(71) Applicant: NXP B.V.

(72) Inventor: Ulrich Moehlmann, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/080,222

(22) Filed: Mar. 24, 2016

(65) Prior Publication Data

US 2016/0344396 A1    Nov. 24, 2016

(30) Foreign Application Priority Data

May 20, 2015   (EP) ..................................... 15168347

(51) Int. Cl.
| | |
|---|---|
| H03L 7/06 | (2006.01) |
| H03L 7/095 | (2006.01) |
| H03L 7/093 | (2006.01) |
| H03L 7/099 | (2006.01) |

(52) U.S. Cl.
CPC .............. *H03L 7/095* (2013.01); *H03L 7/093* (2013.01); *H03L 7/0991* (2013.01); *H03L 2207/50* (2013.01)

(58) Field of Classification Search
USPC ......................................................... 327/159
See application file for complete search history.

(56) References Cited

U.S. PATENT DOCUMENTS

| | | | |
|---|---|---|---|
| 5,159,292 A | 10/1992 | Canfield et al. | |
| 6,404,825 B1 | 6/2002 | Efstathiou | |
| 2003/0093702 A1* | 5/2003 | Luo | G06F 1/32 713/320 |
| 2005/0078783 A1* | 4/2005 | Okita | H03L 7/087 375/376 |
| 2007/0090887 A1 | 4/2007 | Seefeldt et al. | |

FOREIGN PATENT DOCUMENTS

EP   1513257 A2   3/2005

OTHER PUBLICATIONS

Extended European Search Report for Patent Appln. No. 15168347.1 (Nov. 25, 2015).

* cited by examiner

*Primary Examiner* — Lincoln Donovan
*Assistant Examiner* — Patrick Chen
(74) *Attorney, Agent, or Firm* — Rajeev Madnawat

(57) ABSTRACT

A phase locked loop is disclosed comprising: a phase detector, loop filter and a frequency controlled oscillator. The phase detector is configured to determine a phase difference between a reference signal and a feedback signal. The loop filter is configured to perform a filtering operation on a signal derived from the phase difference and to provide a control signal. The frequency controlled oscillator is configured to receive the control signal and provide an output signal with a frequency that varies according to the control signal. The phase locked loop further comprises a lock detector, including: a phase lock detector configured to receive a first signal from the phase locked loop, and to derive a phase lock signal from the first signal; a frequency lock detector configured to receive a second signal from the phase locked loop, and to derive a frequency lock signal from the second signal. An unlock detector may be provided, configured to determine whether the first signal has changed by a predetermined amount during a predetermined period.

15 Claims, 1 Drawing Sheet

PHASE LOCKED LOOP WITH LOCK DETECTOR

CROSS-REFERENCE TO RELATED APPLICATIONS

This application claims the priority under 35 U.S.C. §119 of European Patent application no. 15168347.1, filed on May 20, 2015, the contents of which are incorporated by reference herein.

FIELD

The present disclosure relates to a lock detector for a phase locked loop, and a phase locked loop comprising the lock detector.

BACKGROUND

Phase locked loops (or PLLs) are used to generate an output signal with a defined phase and frequency relationship to an input reference signal. The output signal is matched to the phase of the input reference signal by a feedback loop in which the phase difference between the input reference signal and the output signal is determined by a phase detector. In a digital phase locked loop, the phase detector outputs a digital signal. The output from the phase detector (indicating phase error) is received by a loop filter. The loop filter in turn provides an output signal to a frequency controlled oscillator. In an all-digital phase locked loop, the phase detector may output a digital signal, the loop filter may be a digital loop filter, and the frequency controlled oscillator may be a digitally controlled oscillator.

It is often desirable to know whether a PLL has achieved phase lock. For instance, in the context of a PLL being used to generate a local oscillator (LO) signal for a tuner, it is desirable to know if and when the PLL reaches a locked state after a tuning action. It is further desirable to know when the system is out of lock, for example, due to temperature drift or an unsuccessful tuning action.

SUMMARY

According to a first aspect, there is provided a phase locked loop comprising:

a phase detector configured to determine a phase difference between a reference signal and a feedback signal;

a loop filter configured to perform a filtering operation on a signal derived from the phase difference and to provide a control signal;

a frequency controlled oscillator configured to receive the control signal and provide an output signal with a frequency that varies according to the control signal; and a lock detector, including:
  a phase lock detector configured to receive a first signal from the phase locked loop, and to derive a phase lock signal from the first signal, the phase lock signal indicating whether the phase locked loop is in phase lock;
  a frequency lock detector configured to receive a second signal from the phase locked loop, and to derive a frequency lock signal from the second signal, the frequency lock signal indicating whether the phase locked loop is in frequency lock.

A lock detector that includes both a phase lock detector and a frequency lock detector can provide both a very rapid indication of frequency lock, together with a more precise indication of phase lock. The performance of such a lock detector can therefore be appropriate for a wide range of different applications without substantial modification of the detector.

The first signal may be derived from the phase difference, and/or the second signal may be derived from the control signal. Using the phase difference (determined by that phase detector) to determine phase lock is a straightforward way to identify phase lock. Monitoring the control signal from the loop filter is an effective way to determine whether frequency lock has been achieved, and facilitates detection of even small frequency offsets, while enabling high speed frequency lock detection (e.g. before phase lock is detected).

The phase lock detector may comprise a first comparator configured to receive the first signal and to provide a first comparator output signal indicating whether the magnitude of the first signal exceeds a first threshold value.

The phase lock detector may further comprise a first timer configured to receive the first comparator output, and to provide a first timer output indicating whether the first comparator output signal has indicated that the magnitude of the first signal did not exceed the first threshold value for a first period. The first timer may prevent false lock signals that may arise when the phase locked loop is under-damped.

The lock detector may be configured to receive loop filter parameters from the phase lock loop and to determine the first period from the current values of the loop filter parameters. The first timer may be responsive to the condition of the phase locked loop (e.g. the loop filter parameters), and can thereby select a first period that minimises the time taken to reliably indicate phase lock.

The frequency lock detector may comprise a second comparator configured to receive the second signal and to provide a second comparator output signal indicating whether the magnitude of the second signal exceeds a threshold value.

The second signal may be (or be derived from) a frequency controlled oscillator tuning word.

The frequency lock detector may further comprise a second timer configured to: receive the second comparator output and to provide a second timer output indicating whether the second comparator output signal has indicated that the magnitude of the first signal does not exceed the second threshold value for a second period.

The lock detector may be configured to receive loop filter parameters from the phase lock loop and to determine the second period from the current values of the control parameters.

The phase locked loop may further comprise an unlock detector. The unlock detector may be configured to receive a settling period signal from the phase locked loop indicating when the loop is estimated to be in a settling period, and to derive a unlock signal from the settling period signal, the unlock signal indicating when the phase locked loop is not in lock.

It may be more straightforward and rapid to determine that a phase locked loop is out of a locked state. For instance, it can be inferred that a phase locked loop may not be in a locked state immediately after it has been instructed to change phase or frequency (e.g. by altering the reference signal).

The unlock detector may be configured to determine whether the first signal has changed by a predetermined amount during a predetermined period. The predetermined period may be derived from a reference clock, provided to the unlock detector (e.g. the predetermined period may corresponding with a number of cycles, or a cycle, of the reference clock).

The unlock detector may be configured to detect cycle slips of the phase locked loop by periodically determining a difference between consecutive values of the first signal.

The unlock detector may be configured to receive the first signal and to derive the unlock signal from a logical combination derived from the first signal and settling period signals.

The unlock detector may be provided with a reference clock input and may be configured to determine whether the first signal has changed by a predetermined amount during a cycle of a reference clock of the phase locked loop.

The predetermined amount may be derived from a frequency control word that is input to the phase locked loop. The predetermined amount may thereby correspond with detection of a cycle slip during a period of the reference clock.

The unlock detector may be configured to reset the unlock signal when the phase lock signal indicates phase lock, or when the frequency lock signal indicates frequency lock.

The phase lock detector and the frequency lock detector may each be configured to receive the settling period signal, and to indicate phase lock or frequency lock conditional on the settling period signal. False lock signals may thereby be avoided, and the reliability of the lock detector improved.

According to another aspect, there is provided a receiver or a radar comprising the phase locked loop of the first aspect.

The phase locked loop may be an all digital phase locked loop. The loop filter may comprise an integral path comprising an integrator. The loop filter may comprise a proportional path. The phase locked loop may be configured with: a proportional gain factor $k_p$ in the proportional path and an integral gain factor $k_i$ prior to the integrator in the integral path. The frequency controlled oscillator may comprise a switched capacitor LC oscillator, switched capacitor RC oscillator, or may be another type of frequency controlled relaxation oscillator. The frequency controlled oscillator may be a digitally controlled oscillator. Alternatively, the frequency controlled oscillator may be a voltage controlled oscillator (e.g. having a varactor). The control signal may be a digital signal. The output signal from the phase detector may be a digital signal. The loop filter may be a digital loop filter.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
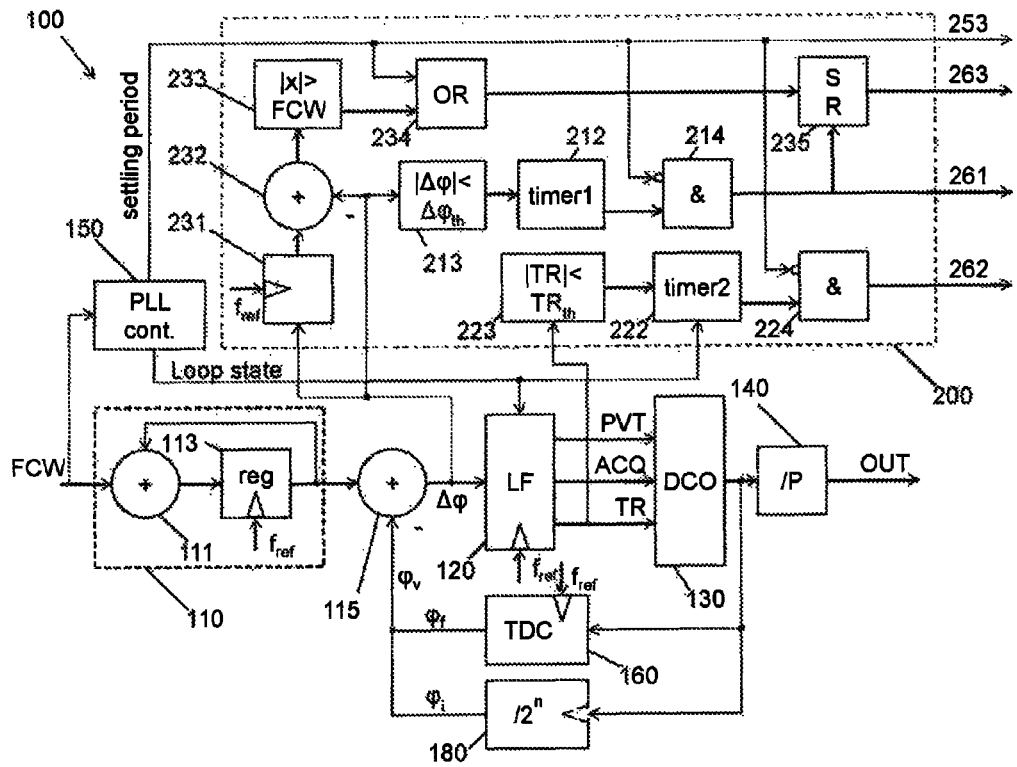
FIG. 1 is a block diagram of a phase locked loop according to an embodiment, comprising a lock detector.

It should be noted that the figures are diagrammatic and not drawn to scale. Relative dimensions and proportions of parts of these figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

In some applications (such as tuners) it is important to know the quality of a local oscillator (LO) signal produced by a phase locked loop (PLL). For example, it may be important to understand if a phase locked loop reaches a lock state after a tuning action, or if the system is out of lock (e.g. due to unsuccessful tuning or a temperature drift). If a tuner comprises a phase locked loop that generates a local oscillator signal, it may be important to minimise the tuning time (i.e. the time for the local oscillator signal to lock onto a new desired frequency and/or phase). In the case of analog reception such as FM/AM radio, the audio may be muted during a tuning action or during background scanning. If the muting interval gets too long it may be audible. If the local oscillator signal quality can be measured, it may be determined that the frequency deviation from the target is sufficiently small that reception can start earlier (i.e. un-muting can happen once the frequency deviation has become small). This may provide additional time for background scanning of more channels, or for data reception.

In the case of digital reception schemes such as DAB (digital audio broadcasting), a locked state of a PLL generating a LO signal may be determined by identifying that the phase error is below a threshold that is sufficient to avoid lost symbols and date re-synchronization.

FIG. 1 is a block diagram of an all digital phase locked loop (ADPLL) 100. The phase locked loop 100 comprises a reference phase generator 110, phase detector 115, loop filter 120, digitally controlled oscillator (DCO) 130, post divider 140, control block 150, time to digital converter (TDC) 160, and feedback divider 180.

The reference phase generator 110 comprises an adder 111 and register 113, arranged to integrate an input frequency control word FCW, and thereby provide a reference phase ramp $\phi_{ref}$.

A phase detector 115 compares the reference phase ramp $\phi_{ref}$ with a feedback ramp $\phi_v$ derived from the output of the DCO 130, and outputs a phase error signal $\Delta\phi$. The feedback ramp $\phi_v$ is determined by combining (e.g. by fixed point concatenation) the output from the feedback divider 180 and the TDC 160.

The loop filter 120 receives the phase error signal $\Delta\phi$, and performs a filtering operation. The loop filter 120 in this example is controlled by a control block 150, which may vary the configuration of the loop filter 120 (e.g. depending on the set FCW, and the loop state). The control block 150 may for example provide proportional gain $k_p$ and integral gain parameters $k_i$ to the loop filter 120.

The loop filter 120 provides three output signals for controlling the DCO 130, these being a process voltage temperature control signal PVT, an acquisition control signal ACQ, and a tracking signal TR. Each of these control signals may control a switched capacitor bank of the DCO 130, so as to vary the output frequency of the DCO 130. In alternative arrangements an frequency controlled oscillator may be used comprising a digital to analog converter and a varactor.

The output from the DCO 130 is received at the post divider 140, which divides the frequency to provide an output signal from the phase locked loop 100 (e.g. for use as a local oscillator signal). The output from the DCO 130 is also received by the feedback register 180 and the TDC 160. The TDC 160 measures and quantizes the timing difference between transitions of the reference frequency $f_{ref}$ and the transitions of the ADPLL output signal. The feedback register 180 accumulates a count of the transitions in the output of the PLL in each reference period. The output $\phi_f$ from the TDC 160 is combined with the output $\phi_i$ from the feedback register 180, for instance by concatenation.

As an illustrative example, the output from the DCO 130 may have a frequency of around 6 GHz. The PVT capacitor bank of the DCO 130 may have a tuning resolution of around 10 MHz, the ACQ capacitor bank may have a tuning resolution of around 0.5 to 1 MHz, and the TR capacitor bank may have a tuning resolution on the order of 10 to 50 kHz.

When a new frequency control word FCW is input to the ADPLL 100, the control block 150 sequentially applies the correct loop filter parameters (e.g. $k_i$ and $k_p$) to the loop filter 120 so that first the PVT output, then the TR output, and finally the TR output can settle. The control block 150 further provides a settling period signal 253, which indicates (e.g. is high) when the control block 150 estimates that the loop filter 120 is in a settling period (prior to lock). The settling period signal 253 may be based on a time estimate generated by the control block 150. The duration of the settling period signal 253 may be derived from a model of the loop filter 120, and or the ADPLL 100. Usually the PLL will have locked to the frequency when the setting period signal indicates that the settling period has completed (i.e. signal 253 goes low).

The phase locked loop 100 further comprises a lock detector 200, configured to determine when the ADPLL 100 is locked and unlocked. The lock detector 200 comprises: a phase lock detector configured to provide a phase lock signal 261, indicating whether the ADPLL 100 is in phase lock; a frequency lock detector configured to provide a frequency lock signal 262, indicating whether the ADPLL 100 is in frequency lock; and an unlock detector configured to provide an unlock signal 263, indicating when the ADPLL 100 is out of lock.

The phase lock detector comprises a first comparator 213, first timer 212 and first AND gate 214. The first comparator 213 is configured to receive the phase error signal $\Delta\phi$, from the phase detector 115, and to output a signal indicating whether the magnitude of the phase error $\Delta\phi$ is below a predetermined threshold $\Delta\phi_{th}$.

The first timer 212 is arranged to receive the output signal from the first comparator 213, and to provide a first timer output indicating whether the first comparator output signal has indicated that the magnitude of the phase error $\Delta\phi$ did not exceed the threshold value $\Delta\phi_{th}$ for a first period. For example, the first comparator 223 may provide a high output when the phase error $\Delta\phi$ is below the threshold $\Delta\phi_{th}$, and the first timer 212 may produce a high output when the output from the first comparator 213 has remained high for the first period. The first period may be determined by the first timer 212, responsive to the loop state (e.g. loop filter parameters) provided by the control block 150. Alternatively, the first period may be determined by the control block 150, responsive to the loop state, and then provided as an input to the first timer 212.

The output from the first timer 212 is provided to a non-inverting input of the first AND gate 214. The settling period signal 253 from the control block 150 is provided to an inverting input of the first AND gate 214, so that the output of the AND gate 214 passes the output signal from the first timer 212 only when the settling period is low (i.e. when the PLL 100 is estimated not to be in the settling period by the control block 150). This helps to avoid false lock signals, which may otherwise occur during settling (e.g. during PVT or ACQ stages). The output from the first AND gate 214 is the phase lock signal 261.

Figure 2:
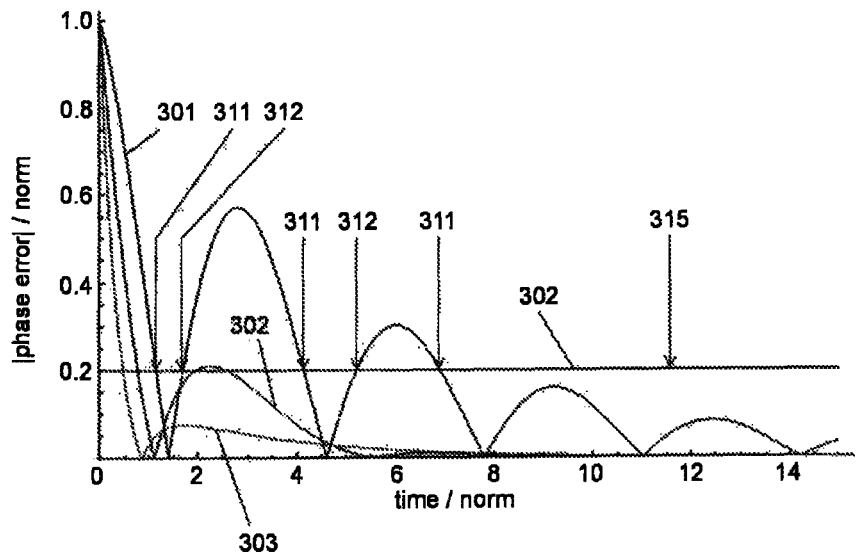
FIG. 2 is a graph showing the settling of phase error for various levels of damping, illustrating the operation of the first timer.

FIG. 2 shows the operation of the first timer 212 in more detail, and comprises three phase error signals 301-303, respectively corresponding with damping factors $\xi<0.7$, $\xi=0.7$ and $\xi>0.7$. An illustrative phase error threshold $\Delta\phi_{th}$, 320, is indicated. If the first comparator 213 indicates a phase error $\Delta\phi$ smaller than the phase error $\Delta\phi_{th}$, the first timer 212 is started. If the phase error $\Delta\phi$ exceeds the threshold $\Delta\phi_{th}$, the first timer is stopped and reset.

In the case of under-damped phase error signal 301, the first timer 212 starts at points 311, and is reset at points 312. After the third timer start 311, the phase error $\Delta\phi$ remains below the phase error threshold $\Delta\phi_{th}$, 320 for the first period, at 315. The first period is selected to avoid the ringing of the phase error resulting in erroneous indication of phase lock. For the phase error 302=0.7), the first timer 212 would start, reset and start again before indicating phase lock. For the phase error 303 ($\xi>0.7$), the first timer 212 would start and not reset.

The value of the first period may be determined by the loop parameters. For instance, for a $2^{nd}$ order system the ringing frequency may be calculated from $\omega=\omega_n\sqrt{1-\xi^2}$, $\xi<1$, the ringing period is then $$T = \frac{1}{2\pi\omega}.$$

The first period may be selected to be at least T/2. This is the fastest time in which phase lock may be indicated in a reliable manner (unless the phase locked loop is always over-damped, which in turn may slow down settling). The first period calculated by the control block 150 or the first timer 212, or a look up table may be used to determine an appropriate first period, responsive to the loop parameters (such as the loop filter parameters $k_i$, $k_p$). When the first timer 212 has been started (without resetting) for the first period, the first timer 212 provides an output signal indicating phase lock (e.g. a high signal) to the AND gate 214.

The frequency lock detector comprises a second comparator 223, second timer 222 and second AND gate 224. The second comparator 223 is configured to receive the TR output from the loop filter 120, and to output a signal indicating whether the magnitude of the TR output is below a predetermined threshold $TR_{th}$. Although the frequency lock receives a different input signal, and has a different threshold value, it otherwise works in the same way as the phase lock detector.

The second timer 222 is arranged to receive the output signal from the second comparator 223, and to provide a second timer output indicating whether the second comparator output signal has indicated that the magnitude of the TR loop filter output did not exceed the threshold value $TR_{th}$ for a second period. For example, the first comparator 223 may provide a high output when the TR loop filter output is below the threshold $TR_{th}$, and the second timer 222 may produce a high output when the output from the second comparator 223 has remained high for the second period. The second period may be determined by the second timer 222, responsive to the loop state (e.g. loop filter parameters) provided by the control block 150. Alternatively, the second period may be determined by the control block 150, responsive to the loop state, and then provided as an input to the second timer 222. The second period may be the same as the first period.

The output from the second timer 222 is provided to a non-inverting input of the second AND gate 224. The settling period signal 253 from the control block 150 is provided to an inverting input of the second AND gate 224, so that the output of the second AND gate 224 passes the output signal from the second timer 222 only when the settling period is low (i.e. when the PLL is estimated not to be in the settling period by the control block 150). The output from the second AND gate 224 is the frequency lock signal 262.

The unlock detector comprises a hold register 231, adder 232, third comparator 233, OR gate 234 and SR flip-flop 235. The hold register 231 is clocked at the reference frequency $f_{ref}$, and receives the phase error $\Delta\phi$ from the phase detector 115. The adder 232 subtracts the phase error $\Delta\phi$ from the phase error held in the hold register 231 from the previous cycle of the reference frequency $f_{ref}$, so as to determine the difference in phase error between consecutive cycles of the reference frequency $f_{ref}$. The output from the adder 232 is provided to the third comparator 233, which is configured to output a signal that indicates whether the output from the adder 232 exceeds the frequency control word FCW (i.e. whether the phase error has changed by more than an amount that corresponds with a cycle slip). The output from the third comparator 233 and the settling period signal 253 are both connected to non-inverting inputs of OR gate 234, so that the OR gate 234 indicates whether the PLL 100 is estimated by the control block 150 to be settling, or when a cycle clip has been detected by the third comparator 233. The output of the OR gate 234 is connected to the S input of the SR flip-flop 235. The phase lock signal 261 is connected to the R input of the SR flip-flop. The SR flip-flop 235 is therefore reset when phase lock is detected, and set when either the control loop 150 indicates that the PLL 100 is settling, or when the unlock detector detects cycle slip. The output of the SR flip flop is the unlock signal 263.

In an alternative arrangement, the unlock detector may be reset by the frequency lock signal. The appropriate arrangement may be determined by the requirements of the system in which the ADPLL 100 is to be applied.

Usually the frequency is already in lock when the settling period ends. The lock detector 200 gets more important if the reference clock $f_{ref}$ is not derived from a crystal, but from a digital controlled crystal oscillator. Then there may be a frequency step in $f_{ref}$ to which the ADPLL 100 needs to respond. Monitoring frequency lock using an output from the loop filter (e.g. TR) allows even small frequency deviations to be detected very fast and indicated by the frequency lock signal 262.

One application for a PLL according to the invention may be a communications device, such as a satellite radio receiver. A further application may be a radar chirp generator, e.g. for use in a vehicle proximity detector.

From reading the present disclosure, other variations and modifications will be apparent to the skilled person. Such variations and modifications may involve equivalent and other features which are already known in the art of phase locked loops, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. A phase locked loop comprising:
a phase detector configured to determine a phase difference between a reference signal and a feedback signal;
a loop filter configured to perform a filtering operation on a signal derived from the phase difference and to provide a control signal;
a frequency controlled oscillator configured to receive the control signal and provide an output signal with a frequency that varies according to the control signal; and
a lock detector, including:
a phase lock detector including a first comparator coupled to a first timer, wherein the first timer is configured to receive a first comparator output from the first comparator, wherein the phase lock detector is configured to receive a first signal from the phase locked loop, and to derive a phase lock signal from the first signal, the phase lock signal indicating whether the phase locked loop is in phase lock;
a frequency lock detector configured to receive a second signal from the phase locked loop, and to derive a frequency lock signal from the second signal, the frequency lock signal indicating whether the phase locked loop is in frequency lock.

2. The phase locked loop of claim 1, wherein the first signal is derived from the phase difference, and the second signal is derived from the control signal.

3. The phase locked loop of claim 1, wherein the first comparator is configured to receive the first signal and to generate the first comparator output signal indicating whether the magnitude of the first signal exceeds a first threshold value.

4. The phase locked loop of claim 3, wherein the phase lock detector is configured to generate a first timer output indicating whether the first comparator output signal has indicated that the magnitude of the first signal did not exceed the first threshold value for a first period.

5. The phase locked loop of claim 4, wherein the lock detector is configured to receive loop filter parameters from the phase lock loop and to determine the first period from the current values of the loop filter parameters.

6. The phase locked loop of claim 1, wherein the frequency lock detector comprises a second comparator configured to receive the second signal and to provide a second comparator output signal indicating whether the magnitude of the second signal exceeds a threshold value.

7. The phase locked loop of claim 6, wherein the frequency lock detector further comprises a second timer configured to: receive the second comparator output and to provide a second timer output indicating whether the second comparator output signal has indicated that the magnitude of the first signal does not exceed the second threshold value for a second period.

8. The phase locked loop of claim 7, wherein the frequency lock detector is configured to receive loop filter parameters from the phase lock loop and to determine the second period from the current values of the control parameters.

9. The phase locked loop of claim 1, further comprising an unlock detector configured to receive a settling period signal from the phase locked loop indicating when the phase locked loop is estimated to be in a settling period, and to derive a unlock signal from the settling period signal, the unlock signal indicating when the phase locked loop is not in lock.

10. The phase locked loop of claim 9, wherein the unlock detector is configured to receive the first signal and to derive the unlock signal from a logical combination derived from the first signal and settling period signals.

11. The phase locked loop of claim 10, wherein the unlock detector is provided with a reference clock input and is configured to determine whether the first signal has changed by a predetermined amount during a cycle of the reference clock.

12. The phase locked loop of claim 11, wherein the predetermined amount is derived from a frequency control word input to the phase locked loop.

13. The phase locked loop of claim 11, wherein the unlock detector is configured to reset the unlock signal when the phase lock signal indicates phase lock, or when the frequency lock signal indicates frequency lock.

14. The phase locked loop of claim 9, wherein the phase lock detector and frequency lock detector are each configured to receive the settling period signal, and to indicate phase lock or frequency lock conditional on the settling period signal.

15. A receiver comprising the phase locked loop of claim 1.

* * * * *